(12) United States Patent
Kim et al.

(10) Patent No.: US 9,509,328 B2
(45) Date of Patent: Nov. 29, 2016

(54) SIGNAL PROCESSING APPARATUS AND METHOD

(71) Applicants: Samsung Electronics Co., Ltd., Suwon-si (KR); The Industry & Academic Cooperation in Chungnam National University (IAC), Daejeon (KR)

(72) Inventors: Ji-Hoon Kim, Daejeon (KR); JongPal Kim, Seoul (KR)

(73) Assignees: Samsung Electronics Co., Ltd., Suwon-si (KR); The Industry & Academic Cooperation in Chungnam National University (IAC), Daejeon (KR)

( * ) Notice: Subject to any disclaimer, the term of this patent is extended or adjusted under 35 U.S.C. 154(b) by 0 days.

(21) Appl. No.: 14/984,046

(22) Filed: Dec. 30, 2015

(65) Prior Publication Data

US 2016/0218732 A1 Jul. 28, 2016

(30) Foreign Application Priority Data

Jan. 27, 2015 (KR) ........................ 10-2015-0012921

(51) Int. Cl.
*H03M 1/00* (2006.01)
*H03M 1/12* (2006.01)

(52) U.S. Cl.
CPC .................................... *H03M 1/124* (2013.01)

(58) Field of Classification Search
CPC ........... H03M 1/1225; H03M 1/1245; H03M 1/468; H03M 1/66; H03M 1/124; H03M 1/38; H03M 1/002; H03M 1/462

USPC .................................................. 341/122–125
See application file for complete search history.

(56) References Cited

U.S. PATENT DOCUMENTS

| | | | |
|---|---|---|---|
| 4,894,565 A * | 1/1990 | Marquardt | G06F 13/14 327/19 |
| 4,894,656 A * | 1/1990 | Hwang | H03M 1/1038 341/120 |
| 5,745,394 A | 4/1998 | Tani | |
| 6,532,280 B1 | 3/2003 | McDonald | |
| 6,822,744 B1 * | 11/2004 | Fischer | G01S 3/808 356/450 |
| 7,224,371 B2 | 5/2007 | Serizawa | |
| 7,592,942 B2 | 9/2009 | Komatsu et al. | |
| 2009/0168924 A1 * | 7/2009 | Gomez | H04B 1/18 375/340 |
| 2013/0002460 A1 | 1/2013 | Panigada et al. | |

FOREIGN PATENT DOCUMENTS

| | | |
|---|---|---|
| JP | 2002-314418 A | 10/2002 |
| JP | 2010-193064 A | 9/2010 |
| JP | 5187146 B2 | 2/2013 |
| KR | 10-2005-0009843 A | 1/2005 |
| KR | 10-2005-0058867 A | 6/2005 |
| KR | 10-1027987 B1 | 4/2011 |

* cited by examiner

*Primary Examiner* — Lam T Mai
(74) *Attorney, Agent, or Firm* — NSIP Law

(57) ABSTRACT

A signal processing apparatus and a method are disclosed, in which the signal processing apparatus may convert an analog signal to a digital signal and store the digital signal. The signal processing apparatus may convert analog signals, transmitted by multiple analog channels, to digital signals using analog-to-digital converters (ADCs), hold the digital signals for a predetermined holding time, sequentially read the held digital signals for each digital channel, and store the sequentially read digital signals.

17 Claims, 17 Drawing Sheets

Time

SIGNAL PROCESSING APPARATUS AND METHOD

CROSS-REFERENCE TO RELATED APPLICATION

This application claims the benefit under 35 USC 119(a) of Korean Patent Application No. 10-2015-0012921, filed on Jan. 27, 2015, in the Korean Intellectual Property Office, the entire disclosure of which is incorporated herein by reference for all purposes.

BACKGROUND

1. Field

One or more embodiments of the following description relates to technology for processing a signal.

2. Description of Related Art

In general, a signal conversion apparatus that converts an analog signal to a digital signal may include an analog multiplexer, a sample and hold circuit, and an analog-to-digital converter (ADC), for example. The analog multiplexer may select an analog input from among analog inputs and output the selected analog input to the sample and hold circuit. The sample and hold circuit may sample the analog input selected by the analog multiplexer and hold a sampled value for a predetermined amount of time. The sample and hold circuit may transmit a resulting held output signal to the ADC for conversion to a digital signal.

SUMMARY

This Summary is provided to introduce a selection of concepts in a simplified form that are further described below in the Detailed Description. This Summary is not intended to identify key features or essential features of the claimed subject matter, nor is the Summary intended to be used as an aid in determining the scope of the claimed subject matter.

One or more embodiments include a signal processing apparatus, including analog-to-digital converters (ADCs) configured to convert analog signals to respective digital signals, digital channels configured to respectively output digital channel signals derived from the digital signals, and a digital signal arbiter configured to respectively hold each of the digital channel signals for a predetermined holding time, sequentially read the respectively held digital channel signals from each digital channel, and output the read digital channel signals.

The digital signal arbiter may include a read signal generator configured to generate a read signal, based on a clock signal, to control a reading of each digital channel signal from the digital channels.

The digital signal arbiter may be configured to selectively read one of the digital channel signals from the digital channels based on the read signal, and output the selectively read digital channel signal.

A minimum cycle, among respective cycles of the digital channel signals, may be greater than a result of a multiplying of a cycle of a clock signal and a total number of the digital channel signals.

The digital signal arbiter may include a packet data generator configured to generate packet data including data of one of the digital channel signals and an identifier identifying a digital channel that provides the one digital channel signal.

The predetermined holding time may be determined based on a cycle of a clock signal and a total number of the digital channel signals.

One or more embodiments include a signal processing apparatus, including analog-to-digital converters (ADCs) configured to respectively convert analog signals transmitted by analog channels to digital signals, an ADC processor configured to generate a valid output notification signal indicating whether an output from one of the ADCs is a valid digital signal for a target digital channel, from among plural digital channels, and a digital channel processor configured to selectively output a digital signal, derived from the digital signals, to the target digital channel, based on the generated valid output notification signal.

The digital channel processor may be configured to derive the digital signal by separating, from at least one of the digital signals, one or more digital signals set for output to the target digital channel.

The ADC processor may be configured to generate the valid output notification signal based on a received first connection control signal including connection information on a connection between an analog channel and the one ADC, and a received signal conversion notification signal indicating completion of a corresponding signal conversion performed by the one ADC.

The ADC processor may include a first flip-flop configured to delay a value of the first connection control signal in response to a sampling control signal of the one ADC and to output the delayed value, and a second flip-flop configured to generate the valid output notification signal based on the received signal conversion notification signal and the delayed value of the first connection control signal output by the first flip-flop.

The ADC processor may further include a first logic gate configured to output, to the second flip-flop, a result of a logical operation based on a user control signal for controlling a connection between the one ADC and at least one of the digital channels and the delayed value of the first connection control signal output by the first flip-flop.

The second flip-flop may be configured to delay the delayed value of the first connection control signal output by the first logic gate based on an inverted signal of the signal conversion notification signal to generate the valid output notification signal.

The ADC processor may include a pulse generator configured to convert the valid output notification signal to a pulse signal based on a digital clock signal.

The digital channel processor may include a digital channel controller configured to select a digital signal, from the digital signals, to be output to the target digital channel based on respective valid output notification signals generated by a plurality of ADC processors.

The digital channel processor may further include a logic gate configured to output, to a flip-flop, a result of a logical operation on the valid output notification signals, and the flip-flop configured to generate the digital signal, derived from the digital signals, to be output through the target digital channel, based on an output signal of the logic gate.

The ADCs may be configured to operate based on different sampling frequencies.

One or more embodiments include a signal processing apparatus, including analog channels respectively configured to provide analog signals corresponding to respective analog signals input to the analog channels, analog-to-digital converters (ADCs) configured to convert the provided analog signals to digital signals, and an analog channel multiplexer configured to control respective connections, between the analog channels and the ADCs, to selectively connect the provided analog signals with the ADCs, wherein the analog channel multiplexer is configured to control the respective connections between the analog channels and the ADCs based on a control signal indicating which provided analog signal is to be input to a particular ADC among the ADCs.

One or more embodiments include a signal processing apparatus, including analog-to-digital converters (ADCs) configured to convert analog signals to digital signals, digital channels configured to respectively process the digital signals, and a digital channel multiplexer configured to control respective connections of the digital signals output by the ADCs and the digital channels, wherein the digital channel multiplexer is configured to control the respective connections of the digital signals output by the ADCs and the digital channels based on a valid output notification signal indicating an output of a valid digital signal from an ADC of the ADCs.

One or more embodiments include a signal processing apparatus, including analog-to-digital converters (ADCs) configured to convert analog signals transmitted by analog channels to respective digital signals, where one or more of the respective digital signals are mixed digital signals that are converted from analog signals from more than one of the analog channels, and a digital channel multiplexer configured to separate the mixed digital signal into separated digital signals, and output the separated digital signal to different digital channels.

The digital channel multiplexer may be configured to provide separated digital signals respectively derived from different ADCs to a same digital channel.

The digital channel multiplexer may include an ADC processor configured to output a valid output notification signal indicating an output of a valid digital signal for a target digital channel from an ADC of the ADCs.

The digital channel multiplexer may further include a digital channel processor configured to select a digital signal to be output to the target digital channel, from among the digital signals output from the ADCs, based on the valid output notification signal.

One or more embodiments include a signal processing method, including holding digital signals, respectively set to be output from digital channels, for a predetermined holding time, and sequentially reading the held digital signals based on which digital channel each held digital signal is set to be output to, and outputting the read digital signals.

The outputting may include generating a read signal, based on a clock signal, to control the sequential reading of the held digital signals, and reading one of the held digital signals from one of the digital channels as indicated by the read signal and outputting the read digital signal.

The outputting may further include generating packet data including the read digital signal and an identifier identifying the one digital channel.

A minimum cycle among cycles of the digital signals may be greater than a result of a multiplying of a cycle of a clock signal and a total number of the digital channels.

One or more embodiments include a signal processing method, including converting, by an analog-to-digital converter (ADC), an analog signal transmitted by an analog channel to a digital signal, generating a valid output notification signal indicating whether the digital signal is a valid digital signal for a target digital channel, selecting a digital signal to be output to the target digital channel from among digital signals respectively output from a plurality of ADCs, including the ADC, based on the valid output notification signal, and outputting the selected digital signal to the target digital channel.

The selecting of the digital signal may include separating, from the digital signals output from the ADCs, the digital signal to be output to the target digital channel.

The generating of the valid output notification signal may include generating the valid output notification signal based on a first connection control signal including connection information on a connection between the analog channel and the ADC, and a signal conversion notification signal indicating completion of the converting performed by the ADC.

The selecting of the digital signal may include selecting the digital signal to be output to the target digital channel from among the digital signals output from the ADCs based on valid output notification signals.

One or more embodiments include a non-transitory computer-readable storage medium including processing instructions to cause at least one processing device to implement one or more methods described below.

Other features and aspects will be apparent from the following detailed description, the drawings, and the claims.

Figure 1:
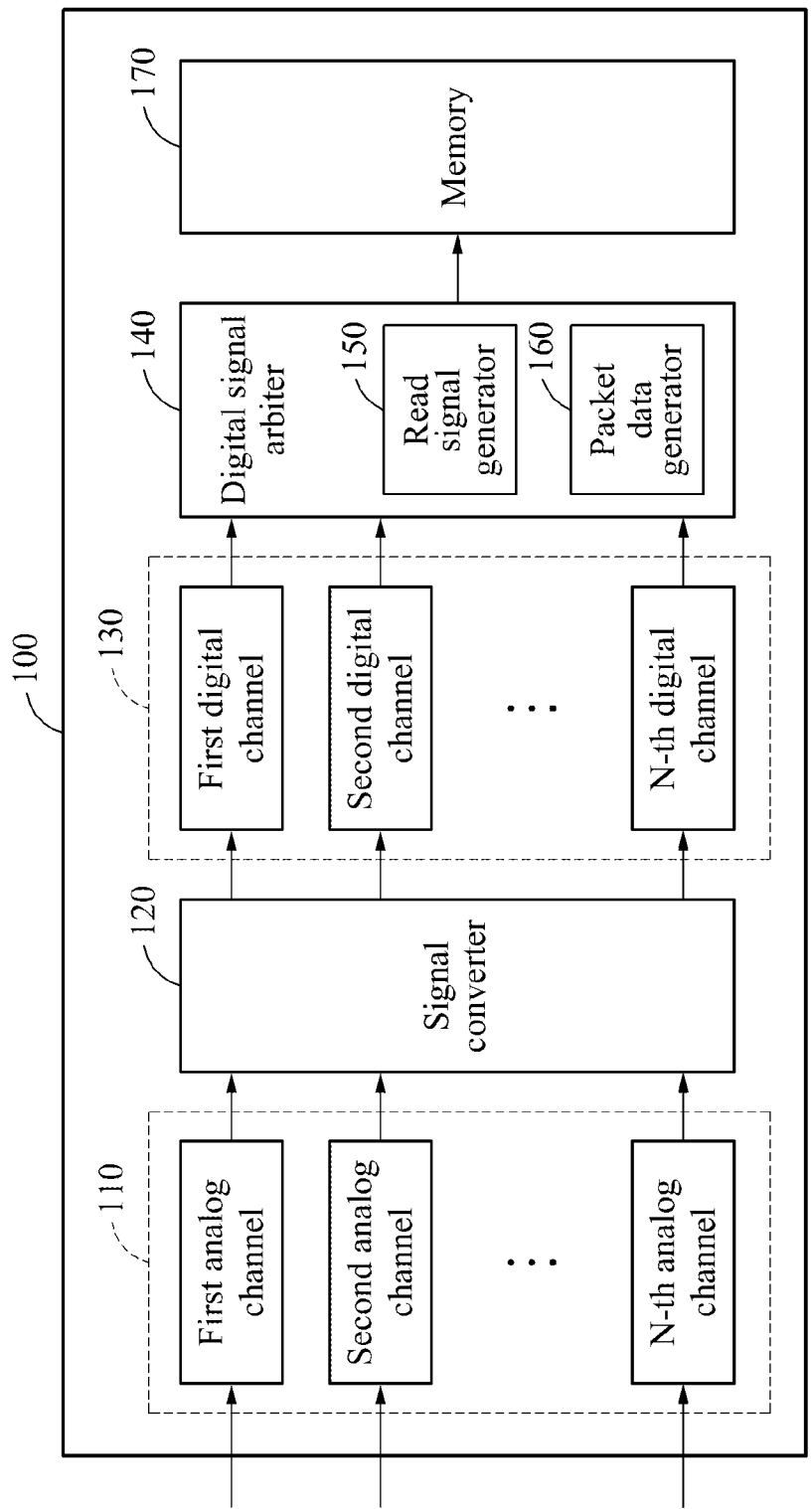
FIG. 1 is a diagram illustrating a signal processing apparatus, according to one or more embodiments.

Throughout the drawings and the detailed description, unless otherwise described or provided, the same drawing reference numerals refer to the like elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein.

However, after an understanding of the present disclosure, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that may be well known to one of ordinary skill in the art may be omitted for increased clarity and conciseness.

The features described herein may be embodied in different forms, and are not to be construed as being limited to the examples described herein.

Various alterations and modifications may be made to the exemplary embodiments, some of which will be illustrated in detail in the drawings and detailed description. However, it should be understood that these embodiments are not construed as limited to the illustrated forms and include all changes, equivalents, or alternatives within the idea and the technical scope of this disclosure.

Terms used herein are to merely explain specific embodiments, thus it is not meant to be limiting. A singular expression includes a plural expression except when two expressions are contextually different from each other. For example, as used herein, the singular forms "a," "an" and "the" are intended to include the plural forms as well, unless the context clearly indicates otherwise. Herein, a term "include" or "have" are also intended to indicate that characteristics, figures, operations, components, or elements disclosed on the specification or combinations thereof exist. The term "include" or "have" should be understood so as not to pre-exclude existence of one or more other characteristics, figures, operations, components, elements or combinations thereof or additional possibility.

Unless otherwise defined, all terms including technical and scientific terms used herein have the same meaning as commonly understood by one of ordinary skill in the art to which this invention belongs, in view of the present disclosure. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Hereinafter, certain embodiments will be explained in more detail with reference to the attached drawings, wherein like reference numerals refer to like elements throughout. Like component or components corresponding to each other will be provided with the same reference numeral, and their detailed explanation will be omitted. When it is determined that a detailed description of a related or known function or configuration may make a purpose of an embodiment of the present disclosure unnecessarily ambiguous, such a detailed description may be omitted.

FIG. 1 is a diagram illustrating a signal processing apparatus 100, according to one or more embodiments.

The signal processing apparatus 100 may convert, to digital signals, multiple analog signals input through a plurality of analog channels 110. The digital signals may be output through a plurality of digital channels 130 and stored in a memory 170. The signal processing apparatus 100 may arbitrate digital signals desiring to access the memory 170 at a same point in time, for example, and store the digital signals in the memory 170 based on arbitration.

Referring to FIG. 1, the signal processing apparatus 100 may include the analog channels 110, a signal converter 120, the digital channels 130, a digital signal arbiter 140, and the memory 170, for example.

Accordingly, a plurality of analog signals may be input through the analog channels 110. For example, analog signals having different characteristics and sensed through various sensors, such as an electrocardiogram (ECG) signal, an electromyogram (EMG) signal, and a photoplethysmogram (PPG) signal, as only examples, may be input through the analog channels 110. In each of the analog channels 110, analog signal processing such as modulation, demodulation, amplification, and filtering, for example, may be performed, e.g., based on characteristics of the respective analog signals.

The analog signals output through the analog channels 110 may be transmitted to the signal converter 120. The signal converter 120 may include a plurality of analog-to-digital converters (ADCs) for signal conversion, and may convert the analog signals received through the analog channels 110 to digital signals using the ADCs. Analog signals from the different analog channels may be selectively provided to separate ADCs or to the same ADC, such that a particular ADC may be generating digital signals that include information from an analog signal from a particular analog channel or information from analog signals from different analog channels. In the latter case, the digital signal may be considered a mixed digital signal, e.g., as including information from analog signals from different analog channels. Thus, the signal converter 120 may classify or separate each of the digital signals and provide the respective classified digital signals to a select digital channel. Said another way, the classifying or separating of a digital signal provided by a particular ADC may include separating from that digital signal information for different analog signals that were selectively input to that particular ADC. A more detailed operation of such a signal converter 120 will be described with reference to FIG. 2.

The digital channels 130 may output, to the digital signal arbiter 140, the digital signals received from the signal converter 120. Each of the digital channels 130 may receive the digital signals, e.g., respectively classified for a corresponding digital channel by the signal converter 120, and perform various digital signal processes or synchronizations of the respective classified digital signals with a digital clock signal, for example. This example digital clock may be for controlling when respective information is read to or by the memory from the respective digital channels. As only examples, each of the digital channels 130 may perform respective signal processing in a frequency domain such as a Fourier transform, modulation and demodulation, filtering, and frequency band power extraction, respective signal processing in a time domain such as averaging, decimation, and interpolation, or another form of signal processing such as wavelet processing, independent component analysis (ICA), and principal component analysis (PCA).

Thus, when storing the digital signals transmitted by the digital channels 130 in the memory 170, the digital signal arbiter 140 may arbitrate digital signals for which storing in a same time section is requested and store the arbitrated digital signals in the memory 170, e.g., based on the aforementioned digital clock signal. As an example, in an embodiment, the memory 170 may be a circular buffer. In addition, each of the digital signals transmitted by the digital channels 130 may have a respective cycle, e.g., which may be the same or different cycles, depending on characteristics of the transitioning digital signal, for example. A minimum cycle among the cycles of the digital signals may be greater than a result of a multiplying of a cycle of a clock signal to be applied to the memory 170 and a number of the digital channels 130 accessing the memory 170.

The digital signal arbiter 140 may perform arbitration by receiving all requests transmitted from the digital channels 130 to the memory 170, e.g., by selecting a digital signal for which access to the memory 170 is allowed from among the digital signals output from the digital channels 130. The digital signal arbiter 140 may respectively hold the digital signals transmitted from the digital channels 130 for a predetermined holding time, sequentially read the held digital signals from the different digital channels, and store the sequentially read digital signals to the memory 170. The digital signal arbiter 140 may hold the digital signals for the predetermined holding time. For example, the predetermined holding time may be, or be based on, a result of a multiplying of the cycle of the clock signal and the number of the digital channels 130 accessing the memory 170. Accordingly, the digital signal arbiter 140 may arbitrate digital signals of the digital channels 130, for which requests for storing to the memory may have been simultaneously made, and store the arbitrated digital signals through a process and system having relatively low complexity.

As illustrated in FIG. 1, the digital signal arbiter 140 may include a read signal generator 150 and a packet data generator 160. The read signal generator 150 may generate a read signal to control the reading of the digital signals to the memory, such as by circulating the reading of the digital signals of the digital channels 130 based on the clock signal to be applied to the memory 170. For example, in an embodiment, the read signal generator 150 may generate the read signal using a counter configured to generate a repeating count value.

The digital signal arbiter 140 may read a digital signal of a digital channel, e.g., as controlled by the read signal, from among the digital signals held for the predetermined holding time, and output the read digital signal to the memory 170. The digital signal arbiter 140 may sequentially verify whether a new digital signal is being provided by each of the digital channels 130 based on the read signal, and sequentially store the new digital signal in the memory 170 when the new digital signal is determined to be present. The packet data generator 160 may generate packet data including a digital signal and an identifier used to identity a digital channel from which the digital signal is output. The digital signal may be converted to a form of the packet data by the packet data generator 160, and stored as in the packet data form in the memory 170 based on the read signal.

Figure 2:
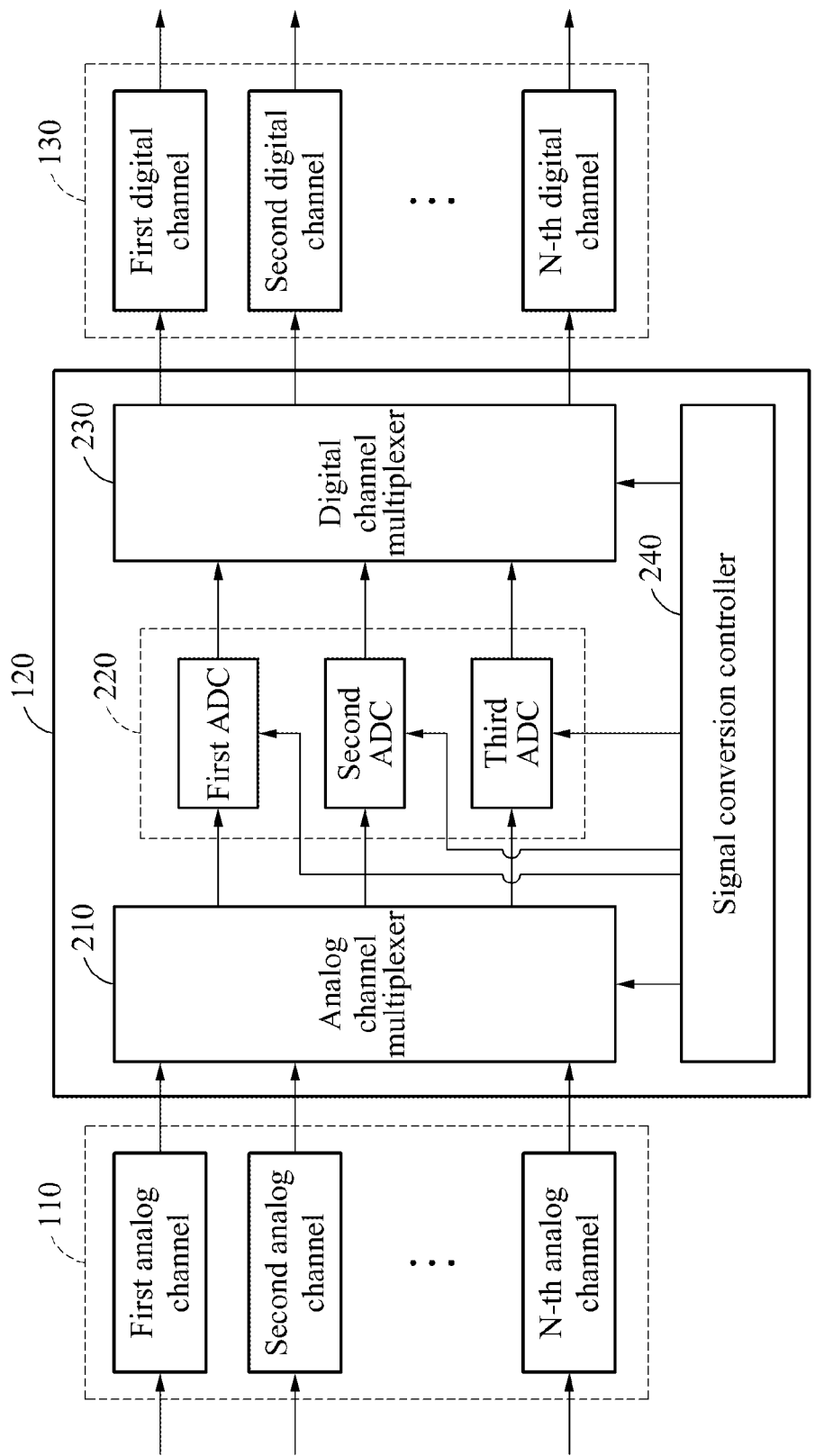
FIG. 2 is a diagram illustrating an operation of a signal converter, according to one or more embodiments.

FIG. 2 is a diagram illustrating a signal converter, such as the signal converter 120 of FIG. 1, according to one or more embodiments.

Referring to FIG. 2, the signal converter 120 may include an analog channel multiplexer 210, a plurality of ADCs 220, a digital channel multiplexer 230, and a signal conversion controller 240, for example.

The signal conversion controller 240 may generate a first connection control signal that may include connection information for desired connections between particular analog channels and particular ADCs using various scheduling algorithms, and transmit the generated first connection control signal to the analog channel multiplexer 210 and the digital channel multiplexer 230, for example. The first connection control signal may be used to determine a point in time at which a particular analog channel and a particular ADC are to be connected or share information.

Thus, the analog channel multiplexer 210 may input an analog signal, among analog signals to be transmitted by analog channels 110, to an ADC based on the first connection control signal received from the signal conversion controller 240. The analog channel multiplexer 210 may control the respective connection between the analog channels 110 and the ADCs 220 based on a control signal indicating the respective structural connection relationship between the analog channels 110 and the ADCs 220 and a control signal indicating which analog signal is to be input to which ADC among the ADCs 220. An analog channel to be connected to a particular ADC of the ADCs 220 may vary over time through the controlling by the analog channel multiplexer 210, e.g., so that over time the same ADC may be controlled to convert analog signals from different analog channels into the same digital signal.

The signal conversion controller 240 may generate a sampling control signal for signal conversion and transmit the generated sampling control signal to each of the ADCs 220. The sampling control signal may be used to determine in which time section an output of an analog channel is to be connected to an input of an ADC. Each of the ADCs 220 may convert an analog signal received through the analog channel multiplexer 210 to a digital signal based on the sampling control signal. Each of the ADCs 220 may convert the received analog signal to the digital signal by sampling and holding the analog signal based on the sampling control signal. In an embodiment, the ADCs 220 may also operate based on different sampling frequencies to effectively convert, to digital signals, analog signals having various input characteristics.

For example, each of the ADCs 220 may output a signal conversion notification signal, e.g., indicating completion of the signal conversion that was initiated by a rising edge of the sampling control signal, and a digital signal including valid information. Thus, as only an example, the completion of the signal conversion of an ADC may be identified by a falling edge of the signal conversion notification signal. The falling edge may occur when the value of the signal conversion notification signal changes to 0 from 1, for example.

Each of the ADCs 220 may convert the respectively received analog signals to digital signals, and output a digital signal in which digital signals to be output through the digital channels 130 are mixed. As noted above, since the ADCs 220 convert select analog signals from the analog channel multiplexer 210 in accordance with a predetermined rule, a digital signal in which digital signals of various analog channels are mixed may be output from each of the ADCs 220. Briefly, as explained below, in an embodiment, the digital channel multiplexer 230 may subsequently selectively un-mix such mixed digital signals, e.g., so that information from each original analog channel is output through a particular corresponding digital channel and/or so that information from a particular analog channel is output through plural select digital channels. As only an example, a digital signal that may ultimately be output through a first digital channel may be included in a point in time of a mixed digital signal output from a first ADC, and a digital signal that may ultimately be output through a second digital channel may be included in another point in time of the mixed digital signal output from the first ADC.

Although the example of FIG. 2 illustrates the signal converter 120 including three ADCs 220, the number of the ADCs 220 may not require or be limited to three and, further, may be less than or equal to a number of the analog channels 110.

As noted, the digital channel multiplexer 230 may classify or separate, which is hereinafter used interchangeably with the term 'classify', the mixed digital signals output from each of the ADCs 220 based on which of the digital channels 130 the separated digital signals are to be output to. As only an example, and noting that additional examples are provided further below, the digital channel multiplexer 230 may separate the digital signals output from the ADCs 220 and output the separated digital signals so as to allow or ensure that the digital representation of an analog signal input through a first analog channel is output through the first digital channel, and to allow or ensure that the digital representation of an analog signal input through a second analog channel is output through the second digital channel. The digital channel multiplexer 230 may control a connection between the ADCs 220 and the digital channels 130 based on a control signal indicating a structural connection relationship between the ADCs 220 and the digital channels 130, and a valid output notification signal indicating that a valid digital signal is output from a corresponding ADC.

The digital channel multiplexer 230 may separate the digital signals output from the ADCs 220 based on the ultimate digital channel that is supposed to carry the separated digital signal. For example, this separation may be based on the first connection control signal received from the signal conversion controller 240 and the respective signal conversion notification signal received from each of the ADCs 220. The digital channel multiplexer 230 may identify which analog channel is connected to a particular ADC based on the first connection control signal, and identify a point in time at which signal conversion is completed by the particular ADC based on the signal conversion notification signal. The digital channel multiplexer 230 may separate the digital signals output from the ADCs 220 and output the separated digital signals immediately, for example, after the signal conversion is completed by each of the ADCs 220.

In an example, an ECG signal may be input to the first analog channel. The ECG signal may be processed through amplification and analog filtering by the first analog channel and then converted to a digital signal by a corresponding ADC. The ECG signal converted to the digital signal may be input to the first digital channel through the digital channel multiplexer 230, and 50 hertz (Hz) band digital low pass filtering may be performed by the first digital channel. A PPG signal having a different characteristic from the ECG signal may be input to a second analog channel. The PPG signal may be processed through amplification, sampling and holding, and analog filtering by the second analog channel and then converted to a digital signal by a corresponding ADC. The PPG signal converted to the digital signal may be input to a second digital channel through the digital channel multiplexer 230, and a 10 Hz band digital low pass filtering may be performed by the second digital channel.

In another example, an ECG signal may be input to the first analog channel, signal processed through amplification and analog filtering by the first analog channel, and then converted to a digital signal by a corresponding ADC. The ECG signal converted to the digital signal may be input to the first digital channel through the digital channel multiplexer 230, and a magnitude of power of an alpha wave, 8 through 15 Hz, band may be determined by the first digital channel. The ECG signal converted to the digital signal may also be input to the second digital channel through the digital channel multiplexer 230, and a magnitude of power of a theta wave, 4 through 7 Hz, band may be determined by the second digital channel. Accordingly, the digital channel multiplexer 230 may output the example digital ECG signal to more than one digital channel.

In still another example, an ECG signal may be input to the first analog channel. The ECG signal may be processed through amplification and analog filtering by the first analog channel and then converted to a digital signal by a corresponding ADC. The ECG signal converted to the digital signal may be input to the first digital channel through the digital channel multiplexer 230. A motion artifact signal associated with the ECG signal may be input to the second analog channel. The motion artifact signal may be processed through amplification and analog filtering by the second analog channel and then converted to a digital signal by a different corresponding ADC. The motion artifact signal converted to the digital signal may also be input to the first digital channel by the digital channel multiplexer 230, and adaptive filtering may be performed by the first digital channel based on the digital ECG signal and the digital motion artifact signal. As a result of the adaptive filtering in the example first digital channel, e.g., with a motion artifact having been removed from the ECG signal by the adaptive filtering, a resultant ECG signal without the motion artifact may be output from the first digital channel. A more detailed example operation of the digital channel multiplexer 230 will be described with reference to FIG. 3.

Figure 3:
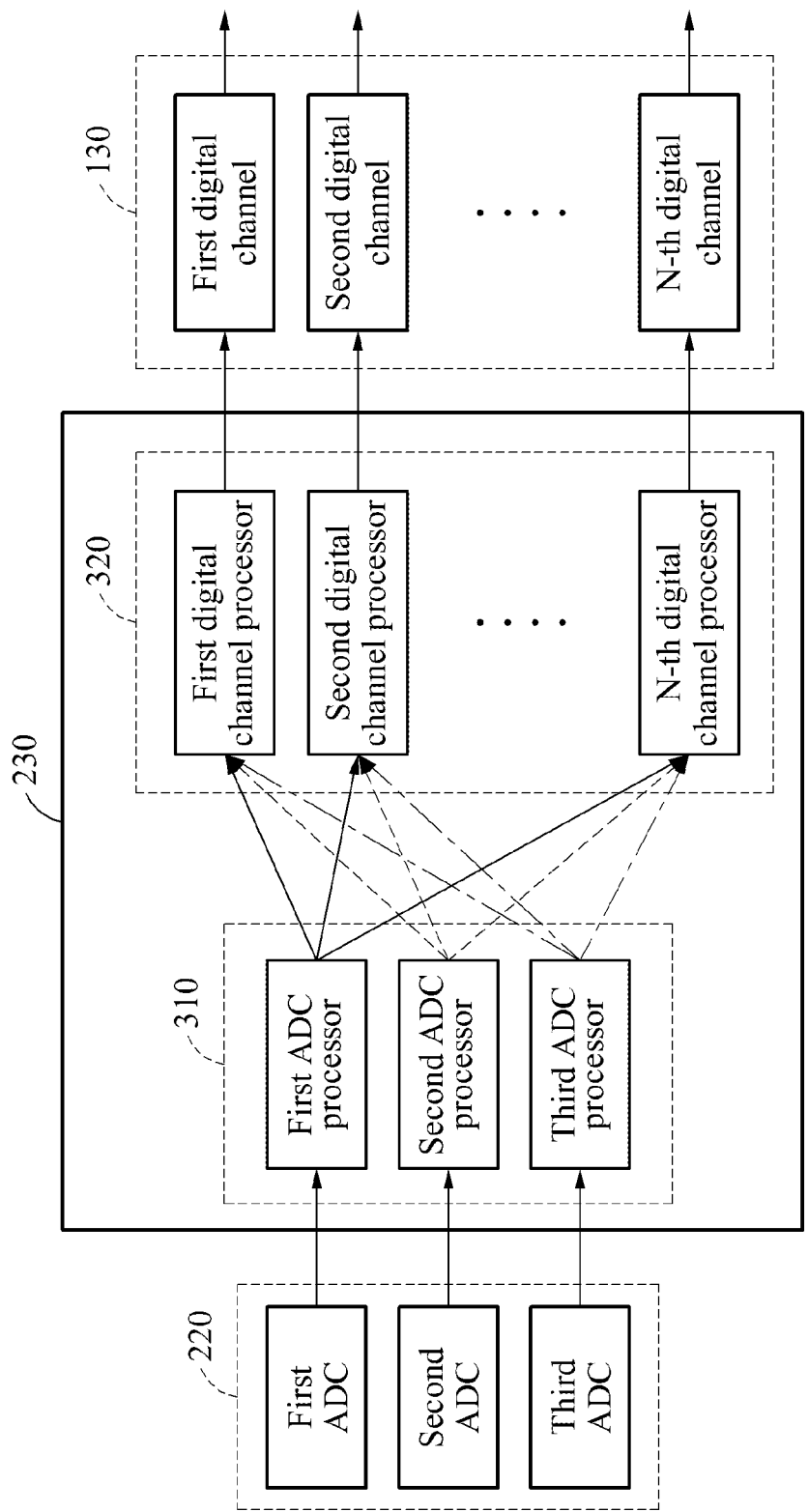
FIG. 3 is a diagram illustrating a digital channel multiplexer, according to one or more embodiments.

FIG. 3 is a diagram illustrating a digital channel multiplexer, such as the digital channel multiplexer 230 of FIG. 2, according to one or more embodiments.

Referring to FIG. 3, the digital channel multiplexer 230 may include a plurality of ADC processors 310 and a plurality of digital channel processors 320, for example.

An ADC processor may be connected to a particular or select ADC, for example. The ADC processor may receive a digital signal output from a particular ADC and transmit the received digital signal to the digital channel processors 320. The ADC processor may output a valid output notification signal indicating that a valid digital signal for a target digital channel is output from the ADC. The ADC processor may generate the valid output notification signal based on a first connection control signal, such as the first connection control signal received from the signal conversion controller 240 of FIG. 2, for example, and a signal conversion notification signal output from the ADC, and then transmit the generated valid output notification signal to the digital channel processors 320. The valid output notification signal may be used to determine which ADC output is to be connected or provided to which digital channel processor. The signal conversion notification signal may refer to a signal indicating that an ADC completed converting an analog signal to a digital signal. For example, at a time the signal conversion is completed by a particular ADC, the ADC may output a signal conversion notification signal, e.g., representing completion of the conversion by a falling edge where a value of 1 changes to a value of 0. The signal conversion notification signal may be used to determine a timing or time section for when a digital signal from an ADC is to be connected or provided to a particular digital channel processor, for example. A more detailed operation of the ADC processors 310 will be described with reference to FIG. 4.

The digital channel processors 320 may respectively generate separated digital signals, to be carried or acted on by a corresponding digital channel, from the digital signals provided by the ADC processors 310, and output the separated digital signal to the corresponding digital channel. The digital channel processors 320 may separate the digital signal that is to be output to a corresponding digital channel from the provided digital signals based on valid output notification signals received from the ADC processors 310. Accordingly, the digital channel processors 320 may select a digital signal of an ADC that is to be output to each of the digital channels 130, from among the digital signals obtained through the signal conversion by the ADCs 220, based on the valid output notification signals. A more detailed operation of the digital channel processors 320 will be described with reference to FIG. 5.

Figure 4:
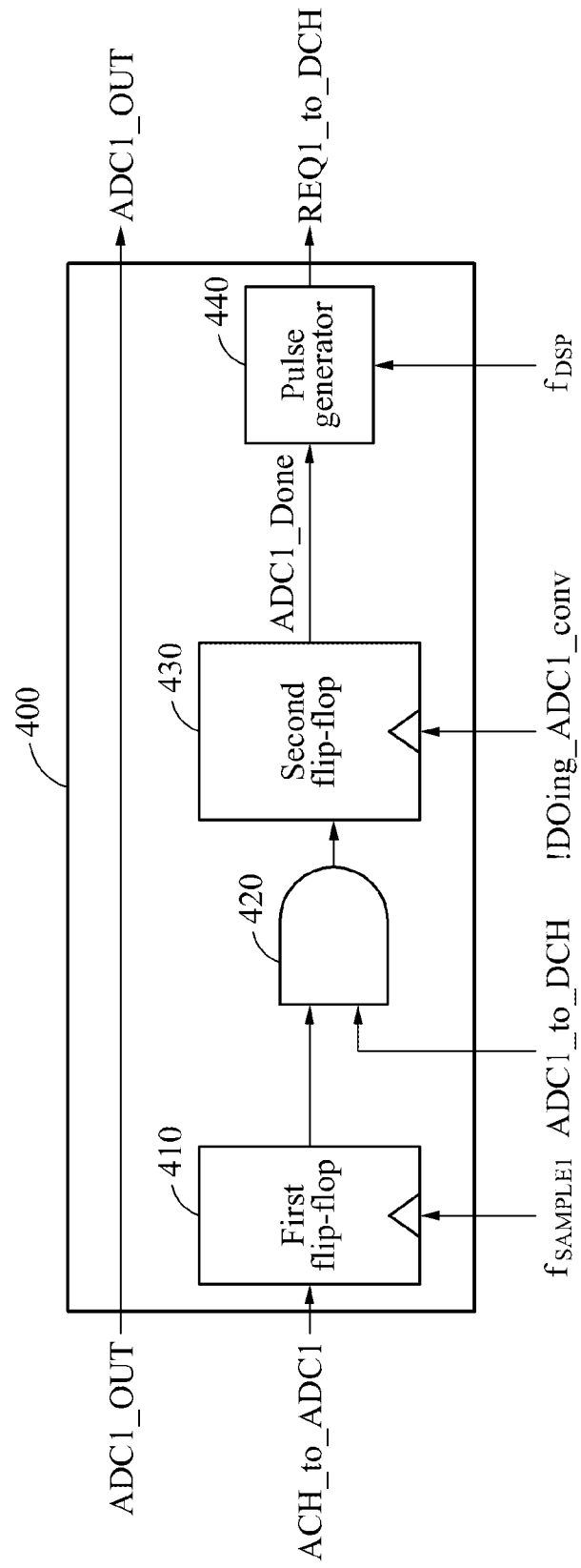
FIG. 4 is a diagram illustrating an analog-to-digital converter (ADC) processor, according to one or more embodiments.

FIG. 4 is a diagram illustrating an ADC processor, such as an ADC processor of the ADC processors 310 of FIG. 3, according to one or more embodiments. In the below discussion regarding FIG. 4, an ADC processor 400 will be considered to be an ADC processor connected to a first ADC, as only an example.

Referring to FIG. 4, the ADC processor 400 may include a first flip-flop 410, a first logic gate 420, a second flip-flop 430, and a pulse generator 440, for example.

As illustrated in FIG. 4, and only as an example, the digital signal ADC1_OUT provided by the first ADC may pass through the ADC processor 400. The first flip-flop 410 may synchronize a received first control signal, for example, ACH_to_ADC1, with a sampling control signal, for example, $f_{SAMPLE1}$, and output the first control signal synchronized with the sampling control signal. The control signal ACH_to_ADC1 may be a signal to control an electrical connection or information provision between a particular analog channel and the first ADC. To perform the synchronization, the first flip-flop 410 may temporarily store or delay a value of the ACH_to_ADC1 signal in response to the $f_{SAMPLE1}$ signal, and output the stored or delayed value of the ACH_to_ADC1 signal. As only an example, the first flip-flop 410 may be a D flip-flop, and output the value of the ACH_to_ADC1 signal at a point in time corresponding to a rising edge of $f_{SAMPLE1}$ signal, e.g., where a value of the $f_{SAMPLE1}$ signal changes from 0 to 1.

In an example, an output signal of the first flip-flop 410 may be input to the first logic gate 420. The first logic gate 420 may perform an AND logical operation on the output signal of the first flip-flop 410 and a user control signal, for example, ADC1_to_DCH, and output a result of the logical operation to the second flip-flop 430. The user control signal ADC1_to_DCH may be a signal to control a connection or information provision between the first ADC and a particular digital channel(s), and may be used to control whether a digital signal transmitted from the first ADC is output to the particular digital channel(s).

The second flip-flop 430 may use a signal conversion notification signal, for example, a control signal Doing_ADC1_conv generated by the signal conversion controller 240, and generate a valid output notification signal, for example, ADC1_Done, indicating that a valid digital signal for a target digital channel is output from the first ADC, based on the output signal of the first flip-flop 410 and the first logic gate 420. An inverted signal, for example, !DOing_ADC1_conv, of the Doing_ADC1_conv signal may be input to the second flip-flop 430 as the control signal. For example, in a case that signal conversion is completed by an ADC and a value of the Doing_ADC1_conv signal is changed to 0 from 1, an inverted control signal of which a value changes to 1 from 0 may be input as the control signal to the second flip-flop 430.

The second flip-flop 430 may synchronize an output signal of the first logic gate 420 with the !DOing_ADC1_conv signal, and output the synchronized signal. For example, to perform the synchronization, the second flip-flop 430 may temporarily store or delay a value of the output signal of the first logic gate 420 in response to the !DOing_ADC1_conv signal, and output the stored or delayed value. For example, the second flip-flop 430 may be a D flip-flop, and output the value of the output signal of the first logic gate 420 at a point in time corresponding to a rising edge of the !DOing_ADC1_conv signal, e.g., at which a value of the !DOing_ADC1_conv signal changes to 1 from 0.

In another example, the output signal of the first flip-flop 410 may not be input to the example first logic gate 420, but instead directly input to the second flip-flop 430. The second flip-flop 430 may generate an ADC1_Done signal based on the output signal of the first flip-flop 410 and a Doing_ADC1_conv signal. Accordingly, the second flip-flop 430 may receive the output signal of the first flip-flop 410 and the !DOing_ADC1_conv signal and output the output signal of the first flip-flop 410 synchronized with the !DOing_ADC1_conv signal. For example, the second flip-flop 430 may output a value of the output signal of the first flip-flop 410 at a point in time corresponding to a rising edge of the !DOing_ADC1_conv signal, e.g., at which a value of the !DOing_ADC1_conv signal changes to 1 from 0.

The pulse generator 440 may convert the ADC1_Done signal output from the second flip-flop 430 to a digital pulse signal, for example, REQ1_to_DCH, in a first cycle based on a digital clock signal, for example, $f_{DSP}$, in a digital domain, and output the REQ1_to_DCH signal. The REQ1_to_DCH signal may be input to each of digital channel processors.

As noted above, the ADC processor 400 may transmit or pass through a digital signal, for example, ADC1_OUT, received from the first ADC to each of the digital channel processors along with the REQ1_to_DCH signal.

The operations described in the foregoing may be performed by an ADC processor connected to another ADC other than the first ADC.

Figure 5:
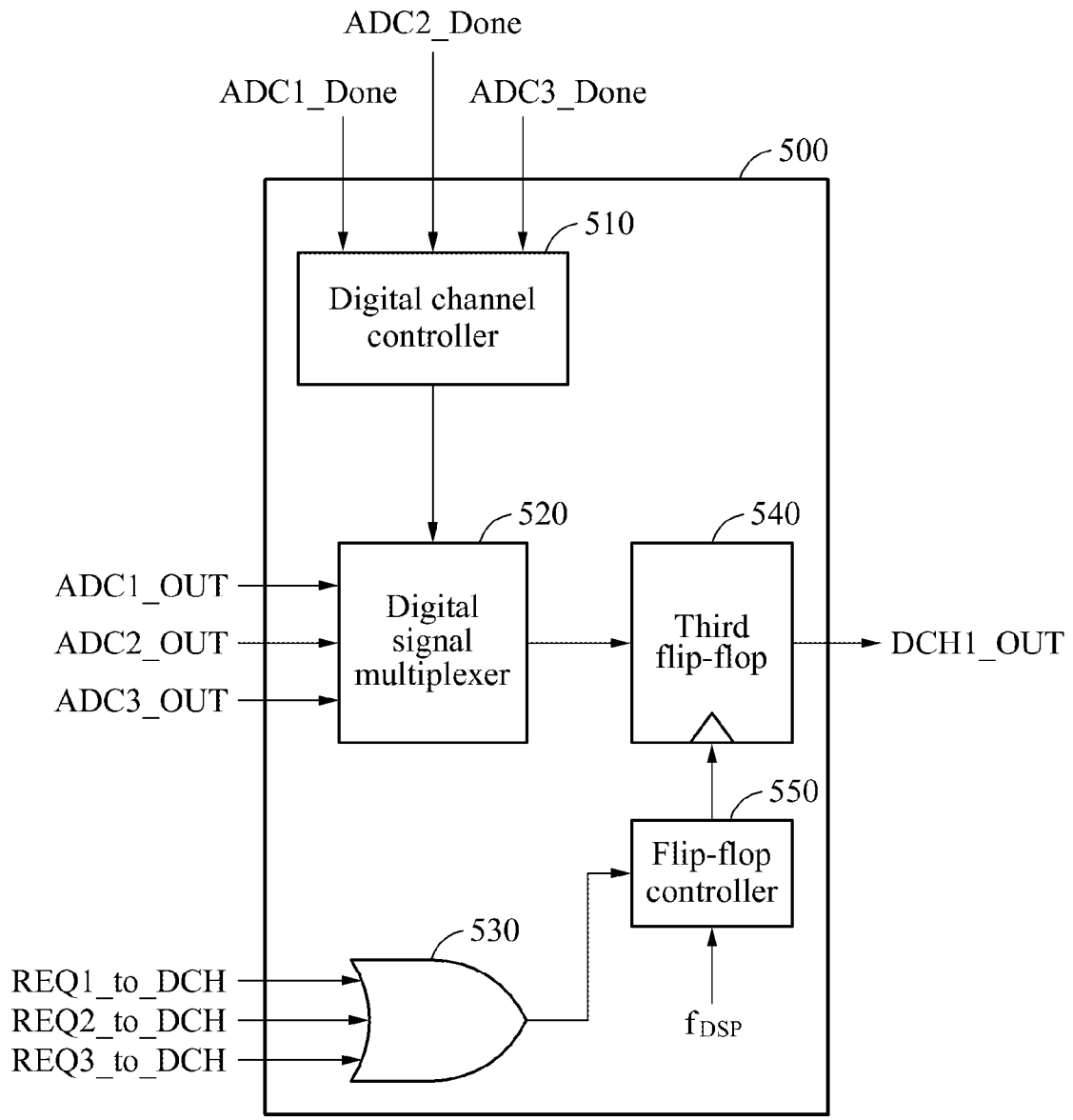
FIG. 5 is a diagram illustrating a digital channel processor, according to one or more embodiments.

FIG. 5 is a diagram illustrating a digital channel processor, such as a digital channel processor of the digital channel processors 320 of FIG. 3, according to one or more embodiments.

Referring to FIG. 5, the digital channel processor 500 may include a digital channel controller 510, a digital signal multiplexer 520, a second logic gate 530, a third flip-flop 540, and a flip-flop controller 550, for example.

The digital channel processor 500 may classify or separate a digital signal from digital signals obtained through signal conversion by ADCs and passed through corresponding ADC processors, for example, ADC1_OUT, ADC2_OUT, and ADC3_OUT, based on valid output notification signals received from the respective ADC processors, for example, REQ1_to_DCH, REQ2_to_DCH, and REQ3_to_DCH, and output a separated digital signal. Digital signals separated from the obtained digital signals may be separated according to which digital channel is supposed to carry those separated digital signals. In the example of FIG. 5, the digital channel processor 500 will be assumed to be selecting a digital signal to be output to a first digital channel, for example, DCH1_OUT, from among the digital signals, but is not limited to the same.

The second logic gate 530 may determine whether a currently valid digital signal is input to the second logic gate 530 based on the valid output notification signals REQ1_to_DCH, REQ2_to_DCH, and REQ3_to_DCH in a form of respective digital pulses received from the ADC processors, such as generated by respective pulse generators 440 described above in FIG. 4. The second logic gate 530 may perform an OR logical operation on the valid output notification signals REQ1_to_DCH, REQ2_to_DCH, and REQ3_to_DCH, and output a result of the logical operation to the flip-flop controller 550.

The digital channel controller 510 may determine a priority of a digital signal to be connected to the third flip-flop 540 among the digital signals obtained from the ADCs. For example, the digital channel controller 510 may select a digital signal to be output to the first digital channel, for example, DCH1_OUT, from among digital signals ADC1_OUT, ADC2_OUT, and ADC3_OUT output from the ADCs, based on valid output notification signals generated by the ADC processors, for example, ADC1_Done, ADC2_Done, and ADC3_Done.

The digital channel controller 510 may receive valid output notification signals ADC1_Done, ADC2_Done, and ADC3_Done, e.g., in a form of a digital pulse, such as output from respective second flip-flops 430 of the respective ADC processors described above in FIG. 4, and generate a second connection control signal to control a connection between the digital signals output from the ADCs and the third flip-flop 540 based on the received valid output notification signals ADC1_Done, ADC2_Done, and ADC3_Done. The digital signal multiplexer 520 may select a digital signal to be input to the third flip-flop 540 from among the digital signals ADC1_OUT, ADC2_OUT, and ADC3_OUT based on the second connection control signal received from the digital channel controller 510.

The third flip-flop 540 may synchronize the digital signal transmitted from the digital signal multiplexer 520 with a control signal output from the flip-flop controller 550, and output the digital signal synchronized with the control signal. The third flip-flop 540 may generate a digital signal to be output through a target digital channel in response to an output signal of the flip-flop controller 550. To implement the synchronization, the third flip-flop 540 may temporarily store or delay a value of a digital signal of an ADC transmitted from the digital signal multiplexer 520, and then output the stored or delayed value of the digital signal. For example, the third flip-flop 540 may be a D flip-flop. In an embodiment, the third flip-flop 540 may output the value of the digital signal of the ADC received from the digital signal multiplexer 520 at a point in time at which a value of an output signal of the second logic gate 530 changes to 1 from 0, and maintain the output until a next valid output notification signal is received. Accordingly, in this example, flip-flop controller 550 may activate the third flip-flop 540 only in an event that a high logic value is output from the second logic gate 530 based on a digital clock signal, for example, $f_{DSP}$. Thus, power consumption of the third flip-flop 540 may be reduced.

Other digital channel processors connected to other digital channels may respectively perform the operations described in the foregoing.

Figure 6:
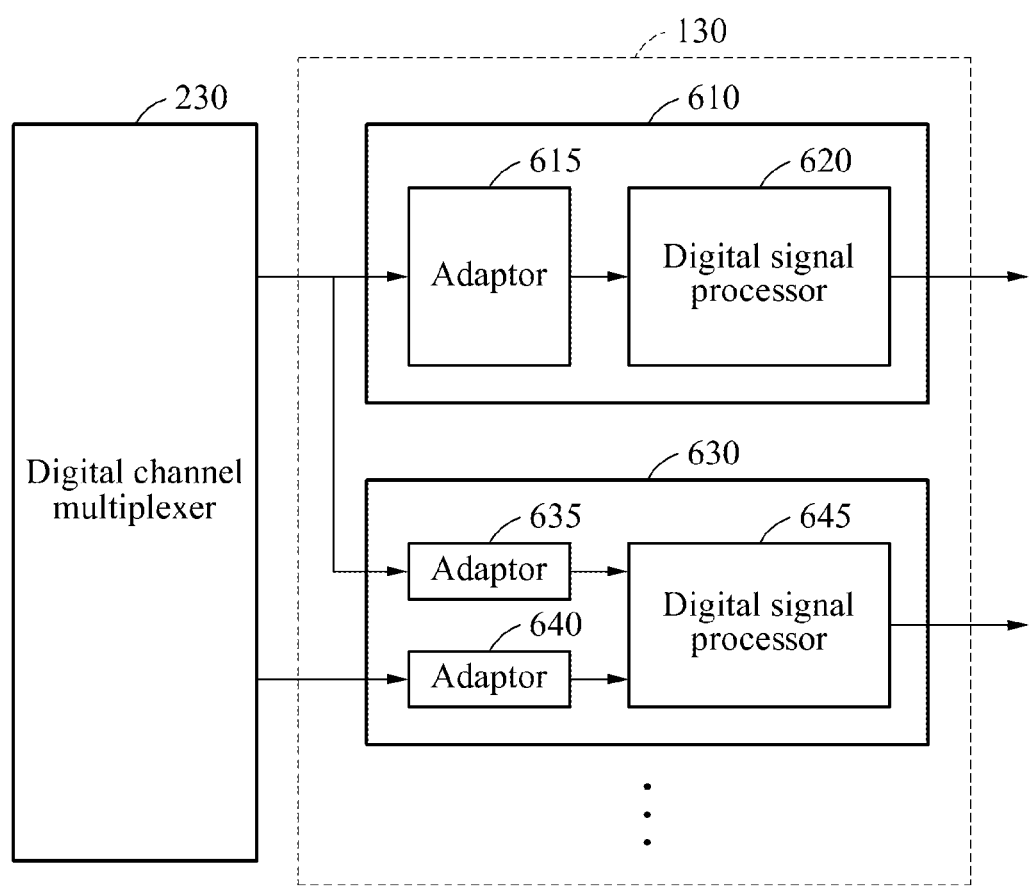
FIG. 6 is a diagram illustrating a digital channel, according to one or more embodiments.

FIG. 6 is a diagram illustrating a digital channel, according to one or more embodiments.

In the example of FIG. 6, a plurality of digital channels 130 including a first digital channel 610 and a second digital channel 630 are illustrated. Referring to FIG. 6, the first digital channel 610 includes an adaptor 615 and a digital signal processor 620 configured to perform digital signal processing on a digital signal transmitted from the adaptor 615. The adaptor 615 may delay a digital signal transmitted from a digital channel multiplexer 230, e.g., based on a time that allows a valid digital signal to be transmitted to the digital signal processor 620. In addition, the adaptor 615 may change a frequency characteristic of the digital signal transmitted from the digital channel multiplexer 230 based on a digital clock signal in a digital domain.

In another example, the second digital channel 630 may receive multiple digital signals that may have different characteristics. The second digital channel 630 may include a plurality of adaptors, for example, an adaptor 635 and an adaptor 640, respectively receiving the digital signals having different characteristics and output from the digital channel multiplexer 230. Each of the adaptors 635 and 640 may delay the received digital signals based on a time that allows a respective valid digital signal to be transmitted to the digital signal processor 645, and change a frequency characteristic of the respective digital signals based on the digital clock signal. The digital signal processor 645 may perform various digital signal processing operations on the digital signals received from the adaptors 635 and 640. For example, the adaptor 635 may receive a digital ECG signal and adaptor 640 may receive a corresponding digital motion artifact signal and the digital signal processor 645 may perform signal processing to remove the artifact from the ECG signal, so that the ultimately output signal is the processed ECG signal with the artifact removed.

Figure 7:
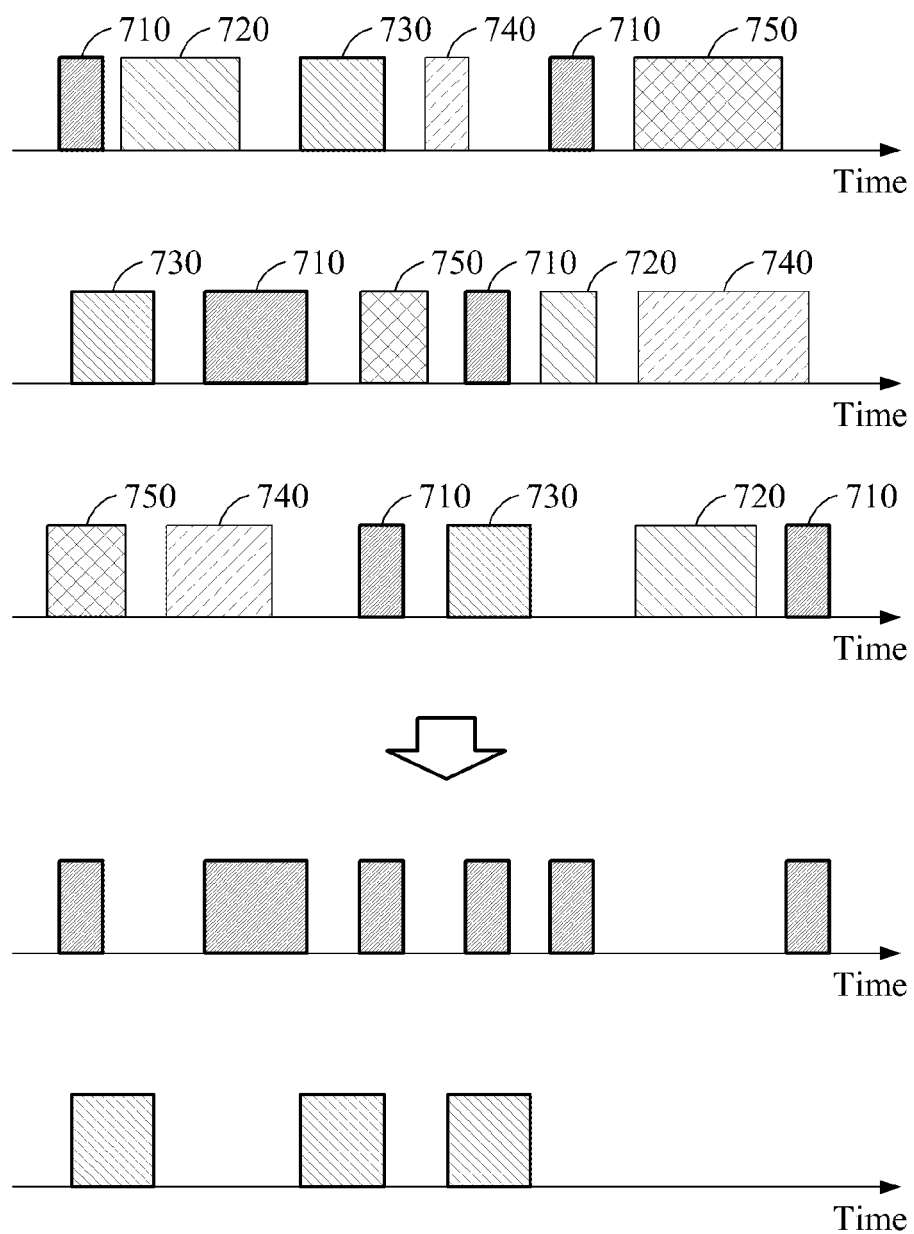
FIG. 7 is a diagram illustrating a process of classifying or separating a digital signal from digital signals output from ADCs for each digital channel, according to one or more embodiments.

FIG. 7 is a diagram illustrating a process of classifying or separating digital signals output from ADCs for each digital channel, according to one or more embodiments.

When the signal converter 120 of FIG. 1 includes three ADCs, as only an example, an uppermost portion graph, a second uppermost portion graph, and a middle portion graph in FIG. 7 respectively represent digital signals to be output from a first ADC, a second ADC, and a third ADC based on time. Analog signals of various analog channels may be input to the ADCs based on time, and the ADCs may output a signal in which respective digital signals of the analog signals are combined or mixed. For example, in the uppermost portion graph in FIG. 7, a digital signal output from the first ADC may be in a form that includes a digital signal 710 obtained through conversion of an analog signal of a first analog channel, a digital signal 720 obtained through conversion of an analog signal of a second analog channel, a digital signal 730 obtained through conversion of an analog signal of a third analog channel, a digital signal 740 obtained through conversion of an analog signal of a fourth analog channel, and a digital signal 750 obtained through conversion of an analog signal of a fifth analog channel.

A digital channel multiplexer 230 of FIG. 3 may separate the digital signals to be output from the ADCs for each digital channel, and output the separated digital channels to corresponding digital channels. For example, from the illustrated uppermost portion graph in FIG. 7, the digital channel multiplexer 230 may selectively separate, from digital signals output from the corresponding first ADC, any one, or combination, of the digital signal 710, the digital signal 720, the digital signal 730, the digital signal 740, and the digital signal 750, and transmit the separated digital signal to a corresponding digital channel. For example, a second lowermost portion graph in FIG. 7 illustrates a digital signal, corresponding to a first analog channel, separated by the digital channel multiplexer 230 and input to a first digital channel corresponding to the first analog channel. A lowermost portion graph in FIG. 7 illustrates a digital signal, corresponding to a third analog channel, separated by the digital channel multiplexer 230 and input to a third digital channel corresponding to the third analog channel. The digital signals separated for each digital channel may be independently processed by a corresponding digital channel based on a characteristic of each digital signal.

Figure 8:
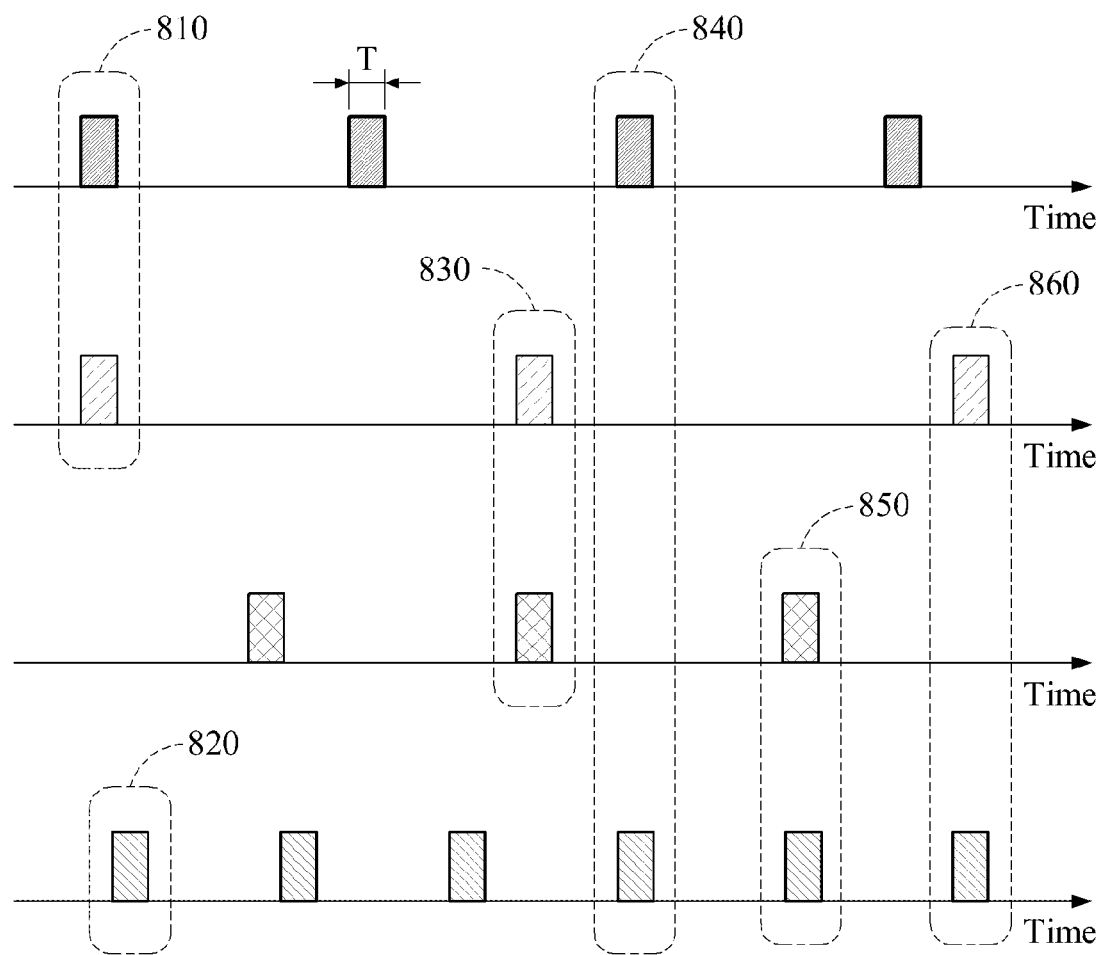
FIG. 8 is diagram illustrating an example of why an arbitrating of digital signals transmitted by multiple digital channels may be desired, according to one or more embodiments.

FIG. 8 is diagram illustrating an example of why an arbitrating of digital signals transmitted by multiple digital channels may be desired, according to one or more embodiments.

Referring to FIG. 8, an uppermost portion graph, a second uppermost portion graph, a second lowermost portion graph, and a lowermost portion graph illustrate respective digital signals to be output from a first digital channel, a second digital channel, a third digital channel, and a fourth digital channel based on time. The digital signals to be transmitted by the four digital channels may be indicated as a request for valid data for a period of a first clock signal to be stored in a memory. The digital signals may be output in different patterns from the four digital channels including a digital signal synchronized with a digital clock signal, which relates to whether which type of a digital signal of an analog signal is input to a corresponding digital channel.

FIG. 8 may demonstrate a desirability for the arbitrating or digital signals transmitted by multiple digital channels. For example, when different digital channels simultaneously make requests for storing digital signals in the memory, a collision may occur among the requests. FIG. 8 illustrates a collision 810 occurring between the first digital channel and the second digital channel at a first point in time, a collision 830 occurring between the second digital channel and the third digital channel at a second point in time, a collision 840 occurring between the first digital channel and the fourth digital channel at a third point in time, a collision 850 occurring between the third digital channel and the fourth digital channel at a fourth point in time, and a collision 860 occurring between the second digital channel and the fourth digital channel at a fifth point in time.

To avoid such collisions, the determining of which digital signal of the different digital channels is to be transmitted to the memory at a particular point in time may be based on a preset priority between the digital channels. In such a case of determining the digital signal of a digital channel to be transmitted to the memory based simply on a priority of the digital channels, additional arbitration may also be performed with another request present in a subsequent clock signal cycle. For example, when a request for the storing made from the first digital channel is not selected, due to the potential collision 810 between the first digital channel and the second digital channel, re-arbitration may be desired with a request 820 for the storing of a digital signal to be subsequently transmitted from the fourth digital channel.

FIGS. 9A through 9G are diagrams illustrating a process of arbitrating and storing digital signals to be output from digital channels, according to one or more embodiments.

Figure 9A:
FIGS. 9A through 9G are diagrams illustrating processes of arbitrating digital signals to be output from digital channels and storing the arbitrated digital signals, according to one or more embodiments.
Figure 9B:
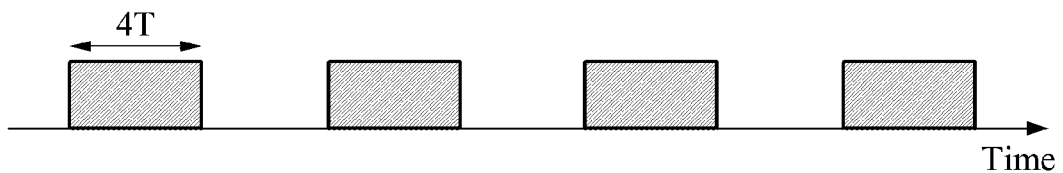
Figure 9C:
Figure 9D:
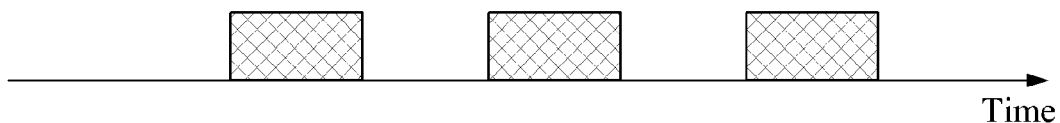
Figure 9E:
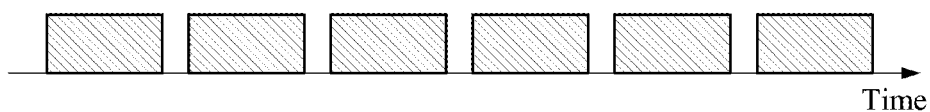

FIG. 9A illustrates a clock signal to be applied to a memory, such as a clock signal to be used when respectively storing information from the digital channels to the memory. The digital signal arbiter 140 of FIG. 1, for example, may respectively hold a digital signal for each digital channel for a predetermined holding time in a form of an example first clock signal cycle based on a clock signal having a cycle T, e.g., based on the clock signal of FIG. 9A. As only an example, assuming that there N digital channels from which respective digital signals are to be stored in the memory, the digital signal arbiter 140 may respectively hold each of the digital signals for N clock signal cycles. Referring to FIGS. 9A through 9G, when 4 digital channels are present, the digital signal arbiter 140 may hold a value of a digital signal for 4 clock signal cycles before providing or making that digital signal available for storing to the memory. For example, FIG. 9B illustrates a holding of a value of the corresponding digital signal for 4 full clock cycles of the clock signal of FIG. 9A. Thus, FIGS. 9B through 9E illustrate a result of holding a digital signal to be output from a first digital channel, a second digital channel, a third digital channel, and a fourth digital channel, respectively, for the example predetermined 4×T cycle.

Figure 9F:

FIG. 9F illustrates an example read signal that may be generated by the read signal generator 150 of FIG. 1, for example.

As demonstrated in FIG. 9F, such a read signal generator 150 may generate the read signal to control a cyclic reading of each digital signal of the respective digital channels, for example, to cyclically read from the first digital channel, then the second digital channel, then the third digital channel, then the fourth digital channel, then the first digital channel, then the second digital channel, etc., to the memory. As only an example, the read signal generator 150 may generate the read signal, to control or initiate the respective reading of the digital signal from each digital channel, using a counter capable of counting to a value of N. In this example, with the count value of the counter being "k" and there being N digital channels, the digital signal arbiter 140 may verify whether a digital signal is being held, e.g., as a logic HIGH for the corresponding N clock signal cycles, in the k-th digital channel. When the digital signal is verified as being held, the digital signal arbiter 140 may transmit the digital signal from the k-th digital channel to the memory in a then current clock signal cycle.

Thus, with respective digital signals being held, e.g., as the logic HIGH for the example predetermined holding time, the respective digital signals may be read according to the read signal in a time duration corresponding to one clock signal cycle. In addition, since a time section in which respective digital signals, from corresponding digital channels, are read is different, a collision among digital channels in requests for storing, such as demonstrated above with FIG. 8, may be eliminated.

Figure 9G:
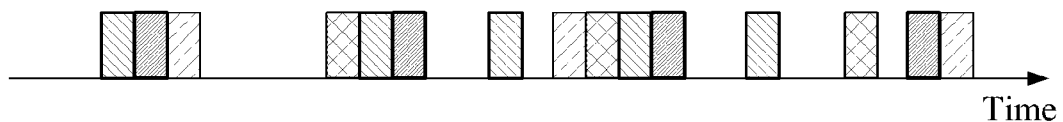

Accordingly, the digital signal arbiter 140 may transmit, to the memory, a digital signal arbitrated based on the read signal. FIG. 9G illustrates digital signals of digital channels arbitrated by the digital signal arbiter 140 as sequentially transmitted to the memory. In an embodiment, to arbitrate the digital signals to be output from the digital channels by the digital signal arbiter 140, a shortest memory input cycle of a digital signal among the digital signals may need to be greater than the result of a multiplying of a cycle of a respective digital clock signal, used for synchronization and access to the memory, and the number of digital channels that desire to access the memory.

Figure 10:
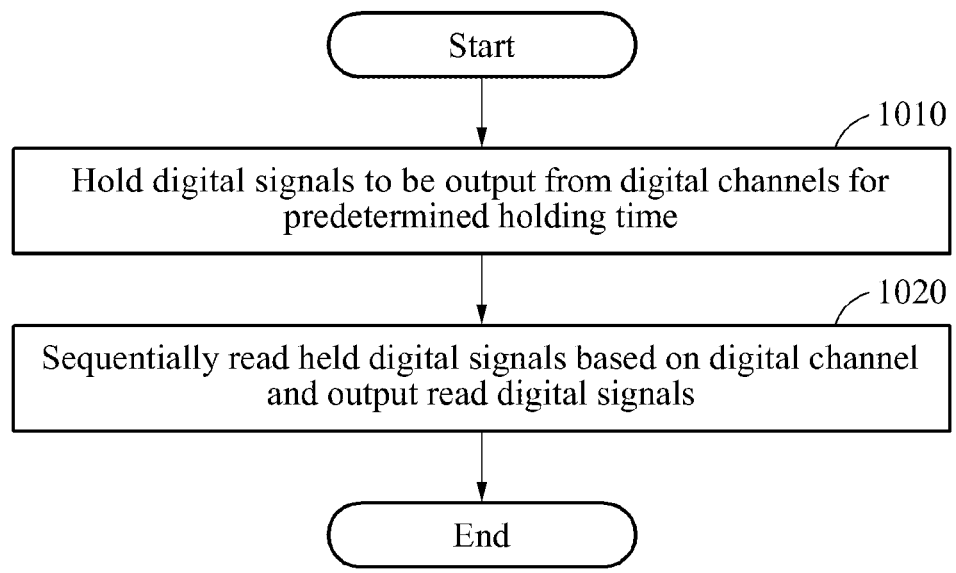
FIG. 10 is a flowchart illustrating a signal processing method, according to one or more embodiments.

FIG. 10 is a flowchart illustrating a signal processing method, according to one or more embodiments. Below, only for ease of explanation, the signal processing method will be described with reference to a signal processing apparatus, noting that embodiments are not limited to the same.

Referring to FIG. 10, in operation 1010, a signal processing apparatus may hold digital signals to be output from digital channels for a predetermined holding time. For example, the signal processing apparatus may hold the digital signals for the holding time, for example, for a time corresponding to a multiplying of a cycle of a clock signal by a number of digital signals accessing a memory. For example, a shortest cycle of cycles of the digital signals may be greater than the result of the multiplying of the cycle of the clock signal and the number of the digital signals.

In operation 1020, the signal processing apparatus may sequentially read the held digital signals, based on their respective digital channels, and output the read digital signal. The signal processing apparatus may generate a read signal to control or initiate the respective reading of the digital signals output from each digital channel based on the clock signal. Thus, the signal processing apparatus may read a respectively held digital signal as indicated by the read signal and output the read digital signal to the memory. In an embodiment, the signal processing apparatus may also generate packet data including the respectively read digital signal and an identifier used to identify the digital channel from which the respectively read digital signal is output, and output the generated packet data to the memory based on the read signal.

Figure 11:
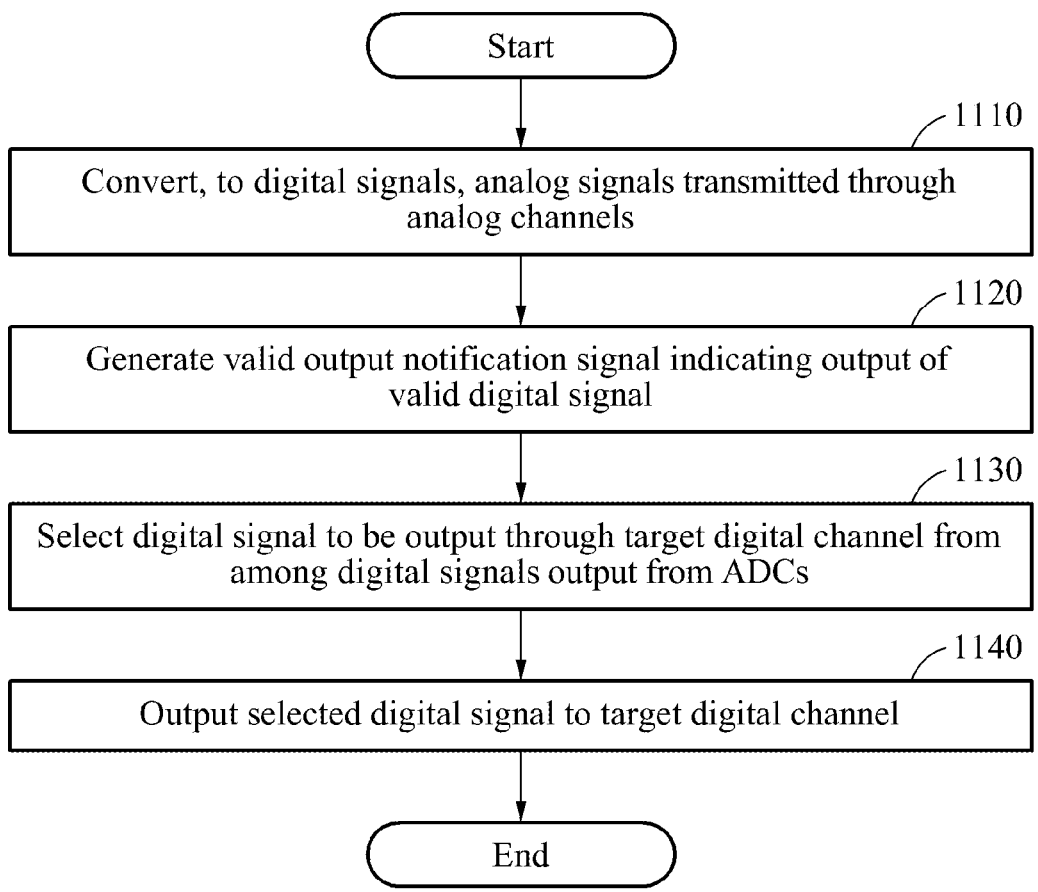
FIG. 11 is a flowchart illustrating a signal processing method, according to one or more embodiments.

FIG. 11 is a flowchart illustrating a signal processing method, according to one or more embodiments. Below, only for ease of explanation, the signal processing method will be described with reference to a signal processing apparatus, noting that embodiments are not limited to the same.

Referring to FIG. 11, in operation 1110, a signal processing apparatus may convert, to a digital signal, an analog signal transmitted by an analog channel. For example, the signal processing apparatus may convert analog signals transmitted by analog channels having various characteristics to digital signals using a plurality of ADCs.

In operation 1120, the signal processing apparatus may generate a valid output notification signal indicating that a valid digital signal is output. The signal processing apparatus may generate the valid output notification signal based on a first connection control signal, e.g., including connection information on a connection between a particular analog channel and a particular ADC, and a signal conversion notification signal indicating that signal conversion of the ADC is completed.

In operation 1130, the signal processing apparatus may select a digital signal to be output through a target digital channel from among digital signals output from the ADCs. Here, the signal processing apparatus may separate a digital signal output from an ADC and select from among the separated digital signals the digital signal to be output to one or more target digital channels. This may be performed for each digital signal respectively output from the ADCs. In addition, the signal processing apparatus may select the digital signal to be output to the target digital channel, from among the digital signals output from the ADCs, based on valid output notification signals.

In operation 1140, the signal processing apparatus may output the digital signal selected in operation 1130 to the target digital channel.

In addition to the elements of FIGS. 1-6 being hardware elements, the methods of FIGS. 7-11 may be implemented by hardware components, including the above discussed example elements and/or one or more processing devices, or processors, or computers, and the signal processing apparatus of FIGS. 1-6 may similarly be included in an electronic device embodiment as hardware components. Hardware components may include, as only examples, resistors, capacitors, inductors, power supplies, frequency generators, operational amplifiers, power amplifiers, low-pass filters, high-pass filters, band-pass filters, analog-to-digital converters, digital-to-analog converters, and processing device(s), processor(s), and/or computer(s). A processing device, processor, or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processing device, processor, or computer includes, or is connected to, one or more memories storing instructions or software that are executed by the processing device, processor, or computer and that may control the processing device, processor, or computer to implement one or more methods described herein. Hardware components implemented by a processing device, processor, or computer may execute instructions or software, such as an operating system (OS) and one or more software applications that run on the OS, to perform or control the operations described herein with respect to FIGS. 7-11, for example. The hardware components also access, manipulate, process, create, and store data in response to execution of the instructions or software. For simplicity, the singular term "processing device", "processor", or "computer" may be used in the description of the examples described herein, but in other examples multiple processing devices, processors, or computers are used, or a processing device, processor, or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, remote processing environments, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 7-11 that perform the operations described herein may be performed or controlled by a processing device, processor, or a computer as described above executing instructions or software to perform the operations described herein.

Instructions or software to control a processing device, processor, or computer to implement the hardware components and perform the methods as described above may be written as computer programs, code segments, instructions or any combination thereof, for individually or collectively instructing or configuring the processing device, processor, or computer to operate as a machine or special-purpose computer to perform the operations performed by the hardware components and the methods as described above. In one example, the instructions or software include machine code that is directly executed by the processing device, processor, or computer, such as machine code produced by a compiler. In another example, the instructions or software include higher-level code that is executed by the processing device, processor, or computer using an interpreter. Based on the disclosure herein, and after an understanding of the same, programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processing device, processor, or computer to implement the hardware components, such as discussed in any of FIGS. 1-6 and perform the methods as described above in FIGS. 7-11, and any associated data, data files, and data structures, are recorded, stored, or fixed in or on one or more non-transitory computer-readable storage media. Examples of a non-transitory computer-readable storage medium include read-only memory (ROM), random-access memory (RAM), dynamic random-access memory (D-RAM), static random-access memory (S-DRAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processing device, processor, or computer so that the processing device, processor, or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processing device, processor, or computer.

As only an example, a processing device, processor, or computer configured to implement software or computer readable code component(s) to perform an operation A may include a processing device, processor, or computer programmed to run software or execute computer readable code or instructions to control the processing device, processor, or computer to perform operation A. In addition, a processing device, processor, or computer configured to implement a software or computer readable code component to perform an operation A, an operation B, and an operation C may have various configurations, such as, for example, a processing device, processor, or computer configured to implement a software or computer readable code component to perform operations A, B, and C; a first processing device, processor, or computer configured to implement a software or computer readable code component to perform operation A, and a second processing device, processor, or computer configured to implement a software or computer readable code component to perform operations B and C; a first processing device, processor, or computer configured to implement a software or compute readable code component to perform operations A and B, and a second processing device, processor, or computer configured to implement a software or computer readable code component to perform operation C; a first processing device, processor, or computer configured to implement a software or computer readable code component to perform operation A, a second processing device, processor, or computer configured to implement a software or computer readable code component to perform operation B, and a third processing device, processor, or computer configured to implement a software or computer readable code component to perform operation C; a first processing device, processor, or computer configured to implement a software or computer readable code component to perform operations A, B, and C, and a second processing device, processor, or computer configured to implement a software or computer readable code component to perform operations A, B, and C, or any other configuration of one or more processing devices, processors, or computers each implementing one or more of operations A, B, and C. Although these examples refer to three operations A, B, C, the number of operations that may implemented is not limited to three, but may be any number of operations required to achieve a desired result or perform a desired task.

As a non-exhaustive example only, and in addition to the above explanation of potential hardware implementations of the electronic device, an electronic device embodiment herein, such as an electronic device embodiment that includes the signal processing apparatus 100 of FIG. 1 as only an example, may also be a mobile device, such as a cellular phone, a smart phone, a wearable smart or bio-signal device, a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a television or display, a DVD player, a Blu-ray player, a set-top box, or a home appliance, an Internet of Things device, or any other mobile or stationary device, e.g., capable of wireless or network communication.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is not limited by the detailed description, but further supported by the claims and their equivalents, and all variations within the scope of the claims and their equivalents are to be construed as being included in the disclosure.

What is claimed is:
1. A signal processing apparatus, comprising:
 a signal converter configured to convert analog signals to digital signals;
 digital channels configured to output digital channel signals derived from the digital signals; and
 a digital signal arbiter configured to:
  hold each of the digital channel signals for a holding time,
  sequentially read the held digital channel signals from each digital channel
  generate a read signal, based on a clock signal,
  selectively read one of the digital channel signals based on the read signal, and
  output the selectively read digital channel signal.
2. The apparatus of claim 1, wherein the signal converter comprises:
 analog-to-digital converters (ADCs) configured to respectively convert analog signals transmitted by analog channels to the digital signals;
 an ADC processor configured to generate a valid output notification signal indicating whether an output from one of the ADCs is a valid digital signal for a target digital channel, from among the digital channels; and
 a digital channel processor configured to selectively output a digital signal, derived from the digital signals, to the target digital channel, based on the generated valid output notification signal.

3. The apparatus of claim 1, wherein a minimum cycle, among respective cycles of the digital channel signals, is greater than a result of a multiplying of a cycle of a clock signal and a total number of the digital channel signals.

4. The apparatus of claim 1, wherein the digital signal arbiter comprises a packet data generator configured to generate packet data comprising data of one of the digital channel signals and an identifier identifying a digital channel that provides the one digital channel signal.

5. The apparatus of claim 1, wherein the holding time is determined based on a cycle of a clock signal and a total number of the digital channel signals.

6. A signal processing apparatus, comprising:
   analog-to-digital converters (ADCs) configured to respectively convert analog signals transmitted by analog channels to digital signals;
   an ADC processor configured to generate a valid output notification signal indicating whether an output from one of the ADCs is a valid digital signal for a target digital channel, from among plural digital channels; and
   a digital channel processor configured to selectively output a digital signal, derived from the digital signals, to the target digital channel, based on the generated valid output notification signal,
   wherein the valid output notification signal is generated based on a received first connection control signal comprising connection information on a connection between an analog channel and the one ADC, and a received signal conversion notification signal indicating completion of a corresponding signal conversion performed by the one ADC.

7. The apparatus of claim 6, further comprising:
   a digital signal arbiter configured to respectively hold each digital signal from the digital channels for a holding time, sequentially read each of the respectively held digital signals from the digital channels, and output the read digital signals.

8. The apparatus of claim 6, wherein the digital channel processor is configured to derive the digital signal by separating, from at least one of the digital signals, one or more digital signals set for output to the target digital channel.

9. The apparatus of claim 6, wherein the ADC processor comprises:
   a first flip-flop configured to delay a value of the first connection control signal in response to a sampling control signal of the one ADC and to output the delayed value; and
   a second flip-flop configured to generate the valid output notification signal based on the received signal conversion notification signal and the delayed value of the first connection control signal output by the first flip-flop.

10. The apparatus of claim 6, wherein the digital channel processor comprises:
    a digital channel controller configured to select a digital signal, from the digital signals, to be output to the target digital channel based on respective valid output notification signals generated by a plurality of ADC processors.

11. The apparatus of claim 10, wherein the digital channel processor further comprises:
    a logic gate configured to output, to a flip-flop, a result of a logical operation on the valid output notification signals; and
    the flip-flop configured to generate the digital signal, derived from the digital signals, to be output through the target digital channel, based on an output signal of the logic gate.

12. A signal processing method, comprising:
    holding digital signals, to be output from digital channels, for a holding time; and
    sequentially reading the held digital signals based on which digital channel each held digital signal is set to be output to;
    generating a read signal, based on a clock signal; and
    reading one of the held digital signals as indicated by the read signal and outputting the read digital signals.

13. The method of claim 12, wherein the outputting comprises:
    generating packet data comprising the read digital signal and an identifier identifying the one digital channel.

14. The method of claim 12, wherein a minimum cycle among cycles of the digital signals is greater than a result of a multiplying of a cycle of a clock signal and a total number of the digital channels.

15. A non-transitory computer-readable storage medium comprising processing instructions to cause at least one processing device to implement the method of claim 12.

16. A signal processing method, comprising:
    converting, by an analog-to-digital converter (ADC), an analog signal transmitted by an analog channel to a digital signal;
    generating a valid output notification signal indicating whether the digital signal is a valid digital signal for a target digital channel based on a first connection control signal comprising connection information on a connection between the analog channel and the ADC, and a signal conversion notification signal indicating completion of the converting performed by the ADC;
    selecting a digital signal to be output to the target digital channel from among digital signals respectively output from a plurality of ADCs, including the ADC, based on the valid output notification signal; and
    outputting the selected digital signal to the target digital channel.

17. The method of claim 16, wherein
    the selecting of the digital signal comprises selecting the digital signal to be output to the target digital channel from among the digital signals output from the ADCs based on valid output notification signals.

* * * * *